(12) United States Patent
Pink et al.

(10) Patent No.: US 10,276,412 B2
(45) Date of Patent: Apr. 30, 2019

(54) HEATING ARRANGEMENT AND METHOD FOR HEATING SUBSTRATES

(75) Inventors: Edwin Pink, Chur (CH); Philipp Hotz, Chur (CH)

(73) Assignee: TEL SOLAR AG, Trubbach (CH)

( * ) Notice: Subject to any disclaimer, the term of this patent is extended or adjusted under 35 U.S.C. 154(b) by 649 days.

(21) Appl. No.: 13/812,289

(22) PCT Filed: Jul. 27, 2011
(Under 37 CFR 1.47)

(86) PCT No.: PCT/EP2011/062912
§ 371 (c)(1),
(2), (4) Date: Nov. 14, 2013

(87) PCT Pub. No.: WO2012/013707
PCT Pub. Date: Feb. 2, 2012

(65) Prior Publication Data
US 2014/0202027 A1    Jul. 24, 2014

Related U.S. Application Data

(60) Provisional application No. 61/367,910, filed on Jul. 27, 2010.

(51) Int. Cl.
*H01L 21/67*    (2006.01)

(52) U.S. Cl.
CPC .. *H01L 21/67115* (2013.01); *H01L 21/67109* (2013.01)

(58) Field of Classification Search
CPC ... F26B 3/30; F26B 3/34; B08B 7/005; H01L 21/67115; C23C 16/46; C23C 16/48;
(Continued)

(56) References Cited

U.S. PATENT DOCUMENTS 4,470,369 A * 9/1984 Edgerton ............. H05B 3/0047
118/718
4,832,778 A * 5/1989 Davis ................ H01L 21/67115
118/50.1
(Continued)

FOREIGN PATENT DOCUMENTS

JP    H07-221037 A    8/1995
JP    2001-332560 A    11/2001
(Continued)

OTHER PUBLICATIONS

Office action issued in Japanese application No. 2013-521130 dated Oct. 27, 2015.
(Continued)

*Primary Examiner* — David J Laux
(74) *Attorney, Agent, or Firm* — Nath, Goldberg & Meyer; Jerald L. Meyer; Stanley N. Protigal (57) ABSTRACT

The invention relates to a vacuum processing system for processing a substrate (2), with an enclosure (1) for carrying the substrate (2) to be treated in a substrate plane (4), whereby the enclosure (1) comprises a first reflecting means (6) and a heating means (5) having a first plane surface (10) and an opposed second plane surface (11), the heating means (5) is configured for irradiating heating energy only via the first surface (10) and/or via the second surface (11), the first reflecting means (6) is configured for reflecting the heating energy irradiated by the heating means (5) onto the substrate plane (4), and the heating means (5) is arranged such that the first surface (10) faces towards the first reflecting means (6) and the second surface (11) faces towards the substrate plane (4).

21 Claims, 2 Drawing Sheets

(58) Field of Classification Search
CPC .. C23C 16/482; H05B 3/0033; H05B 3/0038; H05B 3/0047
See application file for complete search history.

(56) References Cited

U.S. PATENT DOCUMENTS

| | | | |
|---|---|---|---|
| 5,108,570 A | 4/1992 | Wang | |
| 5,700,992 A * | 12/1997 | Honda | C23C 16/46 219/444.1 |
| 6,342,691 B1 | 1/2002 | Johnsgard et al. | |
| 2005/0213951 A1* | 9/2005 | Odagaki | H01L 21/67115 392/418 |
| 2007/0169702 A1* | 7/2007 | Khin Teo | C23C 16/45565 118/725 |
| 2008/0081128 A1 | 4/2008 | Fujii | |
| 2008/0276864 A1* | 11/2008 | Koelmel | H01L 21/6838 118/500 |
| 2010/0055351 A1* | 3/2010 | Kato | C23C 16/45521 427/595 |
| 2010/0059497 A1* | 3/2010 | Ranish | F27B 17/0025 219/395 |
| 2010/0074604 A1* | 3/2010 | Koelmel | H01L 21/67098 392/408 |
| 2010/0151680 A1* | 6/2010 | Wang | C23C 16/4581 438/680 |

FOREIGN PATENT DOCUMENTS

| | | |
|---|---|---|
| JP | 2006-196873 A | 7/2006 |
| JP | 2010-135531 A | 6/2010 |
| JP | 2010135531 A | 6/2010 |
| WO | 00/46840 A1 | 8/2000 |

OTHER PUBLICATIONS

BPS "Customline 200" brochure, section 3.9.1 "Process module", Nov. 1997.

* cited by examiner

HEATING ARRANGEMENT AND METHOD FOR HEATING SUBSTRATES

This is a National Phase Application filed under 35 U.S.C. 371 as a national stage of PCT/EP2011/062912, filed Jul. 27, 2011, an application claiming the benefit from the U.S. patent Application No. 61/367,910, filed Jul. 27, 2010.

TECHNICAL FIELD

The present invention relates to a vacuum processing system for processing a substrate, with an enclosure for carrying the substrate to be treated in a substrate plane. The invention further relates to a method for operating the vacuum processing system, comprising the step of providing a plane substrate having a surface size of $\geq 1$ $m^2$ into the enclosure such that the substrate is provided in the substrate plane.

BACKGROUND ART

Photovoltaic devices, photoelectric conversion devices or solar cells are devices which convert light, especially sun light, into direct current (DC) electrical power. For low-cost mass production thin film solar cells are being of interest since they allow using glass, glass ceramics or other rigid or flexible substrates as a base material, i.e. a substrate, instead of crystalline or polycrystalline silicon. The solar cell structure, i.e. the layer sequence responsible for or capable of the photovoltaic effect, is being deposited in thin layers.

In industrial scale production of photovoltaic cells, the optimization of procedural features in a manufacturing sequence is of major importance. Reliability, throughput, and/or energy efficiency directly affects the price of a product manufactured. Many deposition processors for manufacturing of photovoltaic cells take place at elevated process temperatures of 200° C. or more. Handling, transporting and/or examining of substrates however often require ambient temperatures. It is therefore possible that a substrate needs to undergo several heating/cooling cycles during the manufacturing process. Often such heating/cooling is performed during pump/down or venting cycles in a load lock, i.e. an evacuable enclosure that is operatively connected to a vacuum processing system, and which allows for accessing the vacuum processing system via sealable openings or doors.

Thus, rapid heating and/or cooling of substrate materials directly influences overall systems throughput, which is an essential criterion for a manufacturer due to the expensive hardware required. Consequently, system throughput is directly related to the thermal efficiency of the load lock. Thermal efficiency further depends on the heating rate of the heating elements, such like lamps, and on the substrate uniformity, which both influence the thin film layer quality.

Referring to the manufacturing process of thin film photovoltaic cells, the load lock temperature treatment of substrate material is a prerequisite to deposit high quality ZnO layers for front and/or back electrodes in a thin film application such as DVD, CVD, PECVD, APCVD, or MOCVD. Various ways of temperatures treatment are presently used to heat a base material from ambient temperature to process temperature.

Heating technologies known in the art use short, medium, and/or long wave lamps, with filaments manufactured from tungsten, carbon, graphite, or alike. Each lamp assembly includes a transmissive tube housing the filament. The housings prevent the lamp base materials from oxidation and increase the longevity. Lamp housings are necessary to protect the filament from e.g. oxidizing in ambient atmosphere. On the other hand, the lamp housings narrow the emitted radiation by a certain fraction. This filter effect directly influences the thermal efficiency. Consequently, the efficiency of lamp-based heating systems directly affects the throughput and results in decreased market competiveness for manufacturer of such systems.

Improved, more transmissive lamp housings known from prior art have a certain mass. In general, mass functions as heat reservoir and decreases the system dynamic impairing the controllability of the heating system. Decreasing the temperature controllability and/or stability means that temperature uniformity fluctuates by a certain value. Further, a cooling mechanism needs to be installed to counteract temperature variations, which results in an increased investment volume. In addition to the before described filtration effect, the applied electrical power to the lamp has to be increased to such an extent for compensating the emitted light spectrum loss, which again results in increased energy consumption and subsequently low system energy efficiency. Further, in order to heat extended two-dimensional substrates, several tube-shaped lamps have to be arranged side-by-side to form an array of heating elements. However, this pattern of heating elements will be visible in the heat distribution of the substrate, i.e. has a negative impact as well.

DISCLOSURE OF INVENTION

Therefore, it is an object of the present invention to overcome before described disadvantages of prior art, i.e. to provide a heating system for substrates used for thin film photovoltaic cells that provides an increased system throughput and thus results in decreased manufacturing costs.

This object is achieved by the independent claims. Advantageous embodiments are detailed in the dependent claims.

Particularly, the object is achieved by a vacuum processing system for processing a substrate, with an enclosure for carrying the substrate to be treated in a substrate plane, whereby the enclosure comprises a first reflecting means and a heating means having a first plane surface and an opposed second plane surface, the heating means is configured for irradiating heating energy only via the first surface and/or via the second surface, the first reflecting means is configured for reflecting the heating energy irradiated by the heating means onto the substrate plane, and the heating means is arranged such that the first surface faces towards the first reflecting means and the second surface faces towards the substrate plane.

Thus, the present invention is based on a central idea to provide a "plane" heating means not having a separate housing, as known in prior art systems as described before. This way, the energy conversion process is significantly improved, compared to prior art heating radiators with, for example, quartz housings. As with the solution according to the invention the thermal mass of the heating means is reduced as well, heat system controllability and stability in regards to an assumed cyclic process is significantly increased as well, compared to prior art systems. Preferably, the heating means is provided as a flat strip-like electrically resistive heater element, such as a flat surface heater. The enclosure is preferably adapted for inserting the substrate into the inner of the enclosure such that the substrate, when providing within the enclosure, is providing in the substrate plane, and for taking the substrate out of the enclosure.

The term "processing" in sense of the current invention comprises any chemical, physical and/or mechanical effect acting on the substrate.

The term "substrate" in sense of the current invention comprises a component, part or workpiece to be treated with the vacuum processing system according to the invention. A substrate includes but is not limited to flat-, plate-shaped part having rectangular, square or circular shape. Preferably, the substrate is suitable for manufacturing a thin film solar cell and comprises a float glass, a security glass and/or a quartz glass. More preferably, the substrate is provided as an essentially, most preferably completely flat substrate having a planar surface of a size $\geq 1$ $m^2$, such as a thin glass plate.

The term "vacuum processing" or "vacuum treatment system" in sense of the current invention comprises at least an enclosure for the substrate to be treated under pressure lower than ambient atmospheric pressure.

The term "load lock" in sense of the current invention comprises an evacuable enclosure, operatively connect to the vacuum processing system, which allows access to the vacuum processing system via sealable openings or doors. The vacuum processing systems enclosure is preferably accessible via the load lock without breaking vacuum inside the processing system.

The term "CVD", chemical vapour deposition, and its flavours, comprises in sense of the current invention a well-known technology allowing for the deposition of layers on heated substrates. A usually liquid or gaseous precursor material is being fed to a process system, where a thermal reaction of the precursor results in deposition of the layer. Often, DEZ, diethyl zinc, is used as precursor material for the production of TCO layers in a vacuum processing system using low pressure CVD, LPCVD. The term "TCO" stands for transparent conductive oxide, i.e. TCO layers are transparent conductive layers, whereby the terms layer, coating, deposit and film are interchangeably used within this invention for a film deposited in vacuum process, be it CVD, LPCVD, plasma enhanced CVD (PECVD) or physical vapour deposition (PVD).

The term "solar cell" or "photovoltaic cell", "PV cell", comprises in sense of the current invention an electrical component, capable of transforming light, essentially sunlight, directly into electrical energy by means of the photovoltaic effect. A thin film solar cell usually includes a first or front electrode, one or more semiconductor thin film PIN junctions and a second or back electrode, which are successively stacked on a substrate. Each PIN junction or thin film photoelectric conversion unit includes an i-type layer sandwiched between a p-type layer and an n-type layer, whereby "p" stands for positively doped and "n" stands for negatively doped. The i-type layer, which is a substantially intrinsic semiconductor layer, occupies the most part of the thickness of the thin film PIN junction, whereby the photoelectric conversion primarily occurs in this i-type layer. Thus, the substrate is preferably a substrate used for manufacturing a thin film photovoltaic cell.

The term "plane" comprises in sense of the current invention a means having a surface that is not rough, i.e. does not have grooves or alike. Preferably the term "plane" means that the surface roughness grade of the respective surface is $\leq N9$.

The inventive vacuum processing system is preferably configured such that the reflecting means, e.g. the first reflecting means, reflects heat energy towards the substrate that is irradiated from the heating means side that is averted from the substrate. Thus, the heating means is arranged in such manner preferably within the enclosure in order to multi-reflect the generated heat radiation, such that the substrate is preferably irradiated directly by the heating means and secondly by the reflection occurring from the reflecting means, such that the thermal efficiency is further increased due to a higher absorption rate of the substrate. More preferably, the surface of the reflecting means is arranged parallel to the substrate plane, i.e. to the substrate when provided within the enclosure in the substrate plane. Most preferably, the substrate, when provided within the enclosure, is arranged in a sandwich-like appearance between the reflecting means and the heating means.

According to another preferred embodiment of the invention, the enclosure comprises a second reflecting means configured for reflecting the heating energy irradiated by the heating means onto the substrate and the second reflecting means is arranged such that the second surface of the heating means faces the second reflecting means and that the substrate plane is provided between the heating means and the second reflecting means. Such an embodiment further increases the thermal efficiency as the absorption rate of the substrate is further increased, as with such an embodiment the heating means and the substrate plane are both "sandwiched" between the first reflecting means and the second reflecting means.

In another preferred embodiment, the enclosure comprises a cooling unit for cooling the reflecting means, the reflecting means comprises a first site that faces towards the heating means and an opposed second site that is averted from the heating means and the cooling unit is provided on the second side of the reflecting means in thermal contact with the reflecting means. Preferably, the cooling unit comprises pipes circulating a cooling fluid, such as water or alike. Such an embodiment again increases the thermal efficiency, as the cooling unit increases the reflection factor of the reflecting means, which leads again to an increased absorption rate of heat energy of the substrate.

Generally, the second surface of the heating means can be arranged in any distance away from the substrate plane, i.e. from the substrate when provided within the enclosure. According to an especially preferred embodiment the second surface of the heating means is arranged $\leq 50$ mm, preferably $\leq 40$ mm, more preferably $\leq 10$ mm distant from the substrate plane. Such an embodiment further increases system throughput and lowers overall costs.

In a further preferred embodiment, the heating means comprises a 2-dimensional plane size that has a surface area that is $\geq 5\%$ greater than the surface area of the substrate carryable within the enclosure, the heating means comprises a material selected from the group consisting of carbon composite, carbon reinforced carbon, carbon fiber, SiC coated fiber, graphite, graphite fiber and/or SiC, and/or the heating means comprises a refractory material that unaltered withstands temperatures $\geq 600°$ C. Therefore, it is preferred that the heating means cover the complete surface area of the substrate in its size and comprises the material as outlined before that, when electrical power is applied, the heating means irradiates heating energy from its planar surfaces. Thus, such an embodiment results in a planar heating means having a planar surface that very efficiently heats the substrate when provided within the enclosure.

In a further preferred embodiment, the enclosure comprises a bus bar for supporting the heating means and/or for providing electrical energy to the heating means. The bus bar may comprise clamps or alike means for holding the heating elements in a pre-determined place. In a further preferred embodiment, the enclosure comprises a substrate carrier for carrying the substrate to be treated in the substrate plane.

The substrate carrier may comprise a substrate transfer system for moving the substrate into the enclosure and back away from the enclosure.

In an especially preferred embodiment the heating means comprises a plurality of flat strip-like electrically resistive rectangular heating elements each having a length, a width and a thickness, the heating elements are electrically connected in series and/or in parallel, the heating elements are arranged along their widths and lengths in a plane parallel to the substrate plane forming the first plane surface respectively the second plane surface of the heating means, each heating element comprises a width that is ≥500 times of the thickness of the respective heating element and a length that is ≥3000 times the thickness of the respective heating element and/or the heating elements are arranged adjacent to each other with a distance of 2 times ≥the thickness of the respective heating element, preferably with a distance of ≥4 mm to each other. It is especially preferred that three heating elements are arranged in series and then connected in parallel to each other, which are, for example, electrically connected to a three phase 1000 V energy source. Preferably, the heating elements are located in a plane parallel to the substrate to be heated in the vacuum processing system, whereby it proved especially successful, i.e. efficient for the heating/cooling cycle, if the width is ≤500 times of the thickness of the respective heating element and the length is ≤3000 times of the thickness of the respective heating element. By using these ratios, an especially uniform and efficient heating of the substrate can be carried out, and thus allows for a significant increased throughput of the vacuum processing system compared to prior art systems. In this relation, it is especially preferred that the thickness of the rectangular heating element is ≤0.5 mm, preferably ≤0.15 mm.

Generally, the reflecting means can be provided as any means for reflecting heating energy as known from prior art. However, it is especially preferred that the reflecting means comprises a material selected from the group consisting of copper, copper coating, nickel coating, gold, gold coating, silver, silver coating, aluminum and/or aluminum coating and/or the reflecting means comprises a reflecting surface having a surface roughness grade of ≤N9.

In another especially preferred embodiment the enclosure is provided as a load lock comprising a sealable opening such that the enclosure is accessible without breaking the vacuum when provided within the vacuum processing system.

The object of the invention is further addressed by a method for operating a vacuum processing system according to any of the proceeding claims, comprising the steps of:
a) Providing a plane substrate having a surface size of ≥1 m² into the enclosure such that the substrate is provided in the substrate plane,
b) Evacuating the enclosure to ≤8*10⁻² mbar and to ≥1*10⁻⁵ mbar, and
c) Providing electrical power of ≥26 kW to the heating means for heating the substrate.

This means that a plane substrate provided within the enclosure according to step a), evacuated according to step b), can be heated according to step c), for example by increasing the electrical power stepwise, in order to reach a cycle time of ≤70 s. Thus, the substrate can be heated much faster due to using the heating means according to the invention compared to prior art systems. In such manner, it is preferred that during step c) the electrical power is provided such that the heating rate of the substrate is ≥2.5 k/s. It is further preferred, that during step c) the substrate is periodically or linearly moved within the enclosure in order to increase the homogeneity of the heating energy.

BRIEF DESCRIPTION OF DRAWINGS

These and other aspects of the invention will be apparent from and elucidated with reference to the embodiments described hereinafter.

In the drawings.

DETAILED DESCRIPTION OF DRAWINGS

The present invention addresses a vacuum processing system, which is an integral part of a load lock enclosure. As can be seen from FIG. 1, the vacuum processing system comprises an enclosure 1 for processing a substrate 2 when arranged on a substrate carrier 3 in a substrate plane 4. The enclosure comprises a heating means 5, a first reflection means 6, a second reflecting means 7, cooling units 8 and bus bars 9. The heating means comprises a first plane surface 10 and an opposed second plane surface 11. The reflecting means 6, 7 comprises a first side 12 that faces towards the heating means 5 and an opposed second site 13 that is averted from the heating means 5, whereby the cooling unit 8 is provided on the second side 13 of the reflecting means 6, 7.

Further elements of the load lock, not depicted, may be means for lowering the pressure in the enclosure 1, means for controlling the pressure in the load lock, energy feeds, means for controlling the temperature of the substrate 2 and the heating means 5, either directly or indirectly, and feeds for cooling fluids. The inventive heating means 5 can be employed in a vertical, horizontal or inclined position. In a horizontal arrangement the system may be installed with the heating means 5 arranged beneath, above, or on both sides, above and beneath, of the substrate 2. In a preferred embodiment the substrate 2 is arranged below the heating means 5, as shown in FIG. 1.

In one embodiment the load lock includes as the heating means 5 a plurality of lamp like assemblies, i.e. heating elements 14, without separate housings. This way the energy conversion process is directly improved compared to prior art, which utilizes radiators with for example quartz housings.

The inventive embodiment comprises reflecting means 6, 7, e.g. reflectors, for reflecting heat towards the substrate 2 irradiated from the heating means' 5 side 10 that is averted from the substrate 2. These reflectors 6, 7 are in thermal contact with cooling units 2, e.g. pipes circulating a cooling fluid e.g. water or alike. Reflectors 6, 7 are arranged within the enclosure 1 in order to multi-reflect the generated radiation, which again increases the thermal efficiency due to a higher absorption rate of the substrate 2. With regard to the water cooling, the reflection factor of the reflectors 6, 7 is increased and additionally the thermal mass of the system is decreased. A low thermal mass is the pre-requisite for the heating system controllability and stability in regard to an assumed cyclic process.

Figure 1:
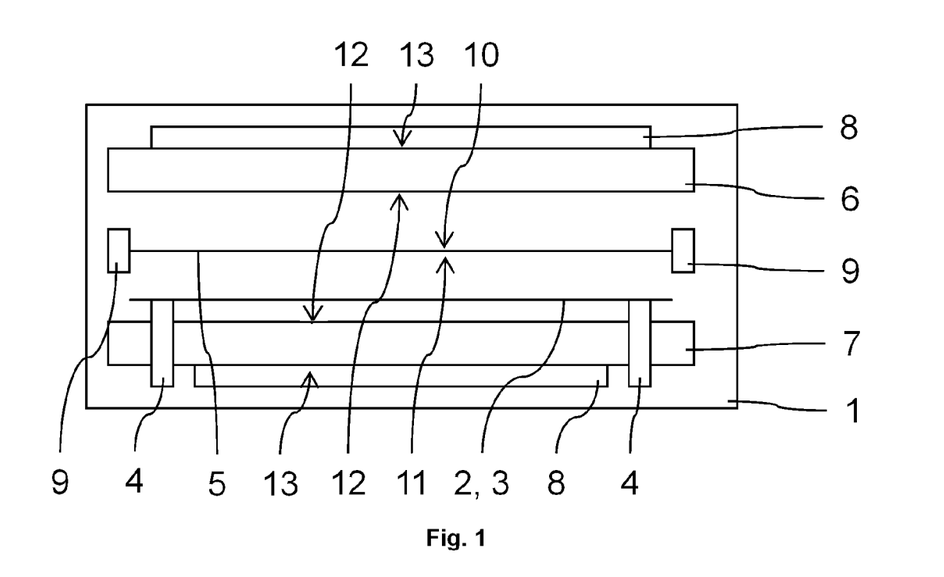
FIG. 1 shows a vacuum processing system according to a preferred embodiment of the invention in a schematic view.

Bus bars 3 are arranged under the reflective surface above the substrate 2 and/or below the substrate 2 above the lower reflective surface, as shown in FIG. 1, e.g. like side rails accommodating the cooling units 8, reflectors 6, 7 and heating means 5 essentially in between them, which gives the system a sandwich like appearance. In an alternative embodiment the carrier structure of the bus bar 3 can be arranged behind heating means 5, reflectors 6, 7 and cooling units 8. The substrate 2 is placed underneath the flat surface radiator 5 in a certain distance. It is held over another reflective surface of the second reflecting means 7 facing the backside of the substrate 2, as shown in FIG. 1, and can be periodically moved during the heating process to improve heating uniformity.

Figure 2:
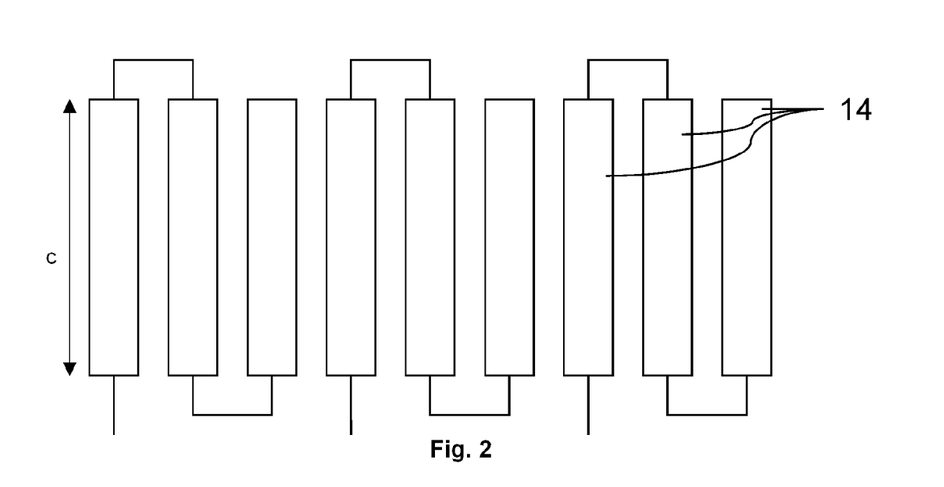
FIG. 2 shows a plurality of heating elements according to the preferred embodiment of the invention in a schematic top-view.
Figure 3:
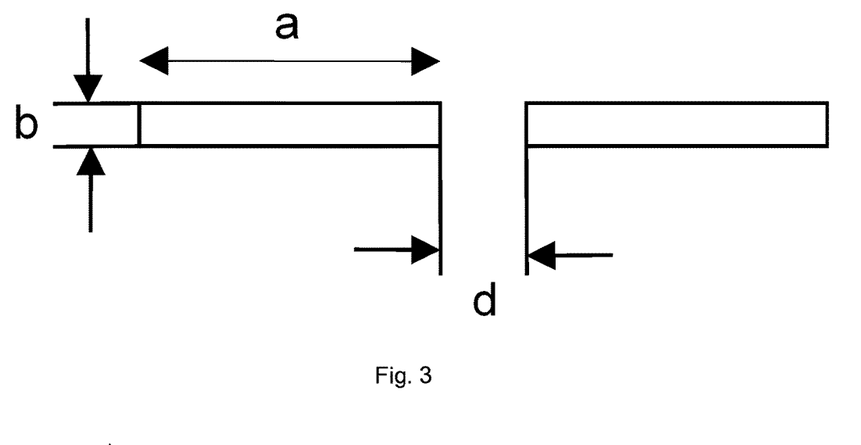
FIG. 3 shows two heating elements according to the preferred embodiment of the invention in a schematic side-view.

In a preferred embodiment, flat, 2-dimensional heater elements 14, as shown in FIG. 2, are positioned underneath and closely related to the upper reflector 6 and cover the complete area above the substrate 2, as shown in FIG. 1. Preferably refractory materials are employed in the system as heating elements 14. Materials like carbon composite materials, carbon reinforced carbon materials, carbon fibers, SiC coated fibers, graphite, graphite fibers, SiC plates, or any combinations thereof are refractory which can withstand temperatures above 600° C. Electrical power applied to these flat strip-like, electrically resistive heating elements 14 results in a plane heating means 5 having a heating surface, compared to the linear lamp arrangements known from prior art. Thus the heater assembly 5, 14 itself can be considered as one uniform flat surface heater.

Thermal efficiency of the heater embodiment is related to the total resistance of the element assembly. Heating elements 14 can be arranged in parallel and in series, as shown in FIG. 2. The total electrical resistance varies with the number of heating elements 14 in serial connection and in parallel connection. Also it is generally known that the resistivity is proportional to the thickness b of the applied material.

In the inventive embodiment three heating elements 14 are arranged in series and three heating elements 14 are then connected in parallel to each other. Thereby a heating element 14 width a-thickness b ratio of ≥500:1 and a heating element 14 length c-thickness b ratio of ≥3000:1 proved to be successful.

The heating elements 14 are located evenly distributed essentially in a plane parallel to the substrate 2 to be heated in the vacuum chamber, maintaining a distance d of few mm, preferably 4 mm between each heating element 14. A holding mechanism, like bus bars 3, clamps or alike hold the radiators 14 in a pre-determined place. Further they supply the heating elements 14 evenly with electrical power over the width and the length of the complete system. Here it proved to be successful to employ means of tensioning, like scroll springs or alike, to position the heating elements 14 in a horizontal direction. Therewith a flat heater surface is defined during thermal expansion and/or contraction caused through temperature increase while applying electrical power to the heating elements 14.

The flat, 2-dimensional heating elements 14 can be made as one single area or as arrangement of rectangular strips arranged side by side. The distance d between individual stripes 14 can be chosen to be far less than the width a of said strips 14, preferably the ratio between gap distance d and thickness b is ≥2:1. Electrically they can be operated individually with separate power sources, or, preferably, wired in series.

As electrical power sources one has to choose between alternating current (AC) and direct current (DC). The advantages of DC power supplies are the flexible controllability and adjustability of voltage. Applying a DC power source avoids the thematic break through voltage in vacuum means, in regard to Paschen's Law.

AC power supplies are generally more competitive in regard to the total system costs per Kilowatt. However AC 3 phase power supplies with 400 V supply voltage are subject to break throughs, arcs, at a certain vacuum. Here an adjusted energy supply process has to be employed in order to avoid system damages caused by break through voltages.

Figure 4:
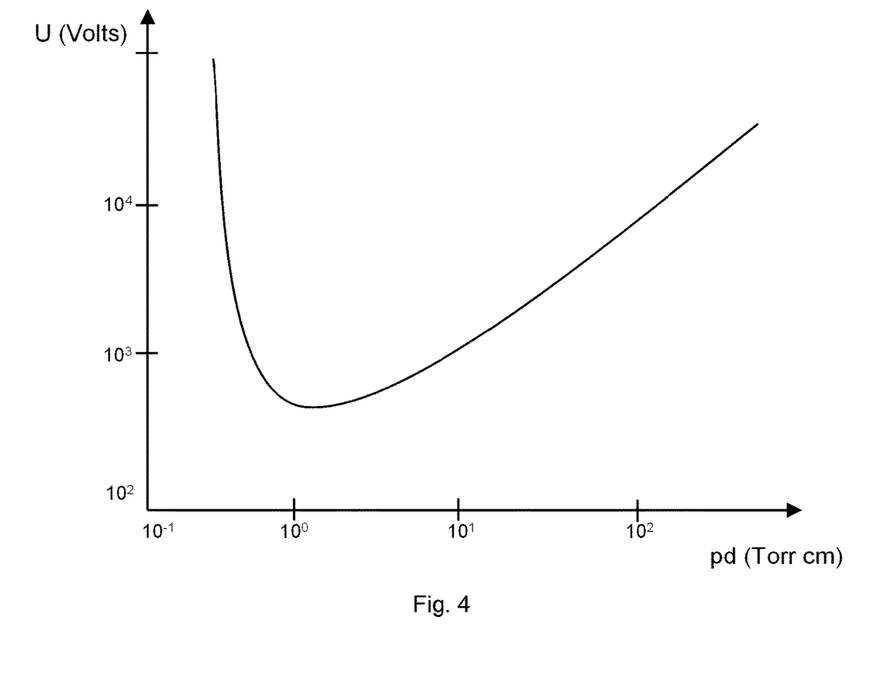
FIG. 4 shows Paschen's curve.

Such arcing is a general problem when large amounts of power are injected into a vacuum chamber. The present invention avoids break down voltages by allowing a certain vacuum level and maintaining the aforementioned element distance d to each other in regard to the Paschen Curve, as shown in FIG. 4. Paschen's law is widely known and determines the break down voltage (Volts) as a function of pressure (Torr) and gap distance (cm) between two parallel plates.

In the inventive embodiment pressures attainable with evacuation means lead to the low pressure side of the Paschen curve, where high voltages can be used. Thus in order to safely use high electrical power≥26 kW the heating process pressure range lays within $8 \times 10^{-2}$ to $1 \times 10^{-5}$ mbar.

Attaining low pressures during the heating process is beneficial for the mean time between failure (MTBF) of the heating elements 14 due to an reduced amount of residue reactant molecules e.g. oxygen. As mentioned afore, high temperatures cause oxidation on the flat surface heater, in case enough residue reactants are within the load lock cavity.

In the inventive embodiment DC as well as AC power supplies can be utilized dependant on the heating element 14 configurations series and/or parallel wise. It proved to be successful to use 3 phase AC power supplies e.g. thyristor controllers, or alike. Further the substrate 2 heat-up rate in Kelvin per Second (K/s) is directly proportional to the available electrical power and therewith the cycle time.

The heater embodiment, i.e. the vacuum processing system, transforms fed in energy directly into radiation, waiving the filtration effect of lamp housings, as used in prior art systems. Therewith the system efficiency is significantly increased in comparison to the way known in the art. Consequently the heat absorption in the substrates 2 is increased and the thermal processing time is being reduced. Thus the energy consumption is decreased due to an optimized cycle time.

The process is as follows: An extended flat substrate 2 with a size≥1 $m^2$ at room temperature is transported from a supply system, e.g. a conveyor or fork, into a compartment, e.g. a load lock or a process chamber. Said compartment is sealable and evacuable and houses a flat surface holder, the substrate carrier 3.

Sensors can be foreseen to indicate when a predefined position of the substrate 2 has been reached. After the substrate 2 has been placed on its intended position in the substrate plane 4, the vacuum chamber is sealed and the heating process starts. Part of the heating process is an evacuation from atmospheric level down to a certain desired pressure range to $8 \times 10^{-2}$ to $1 \times 10^{-5}$ mbar. A pressure measuring means like a gauge controls the process pressure. The heating elements 14 are being switched on when a predetermined process pressure has been reached. As mentioned afore, reduced pressure helps avoiding unwanted break through voltage from the electrically powered heating elements 14 to the usually grounded enclosure 1.

Further in order to control the temperature treatment process in the inventive embodiment, advantageously to utilize a controller e.g. a PID controller. Thus a flexible temperature adjustment can be established interdependent with the injected electrical power.

The amount of injected electrical power determines the heat-up rate in Kelvin per seconds and therewith the processing time. In order to decrease the cycle time to heat a flat substrate 2 from room temperature to 200° C., the electrical power can be increased step wise and/or flexibly.

Here a performance level≥26 kW can be employed in order to reach cycle times ≤70 s. The cycle time for heating up a flat substrate 2 of about 1.4 m² size from room temperature to processing temperature is dependant on the thermal efficiency. Here the arrangement of parts within the embodiment plays an important role. System stability in the cyclic process is the sum of the ambience conditions of the heater embodiment, i.e. the reflecting means 6, 7, cooling units 8, bus bars 9, heating elements 14, enclosure 1, and substrate carrier 3.

The means for reflection 6, 7 have to fulfill a double function. By multi reflecting the radiation e.g. IR emitted by the heating elements 14, the temperature of the flat surface heating elements 14 can reach significantly faster process temperature≥900° C. Consequently the temperature treatment time of the substrate 2 is reduced and the total injected electrical power can be lowered, e.g. ≤2 kWh per substrate 2. In sum the system efficiency can be increased to ≥40% total efficiency compared to prior art systems.

Further the temperature uniformity over the complete substrate 2 and the amount of reflected radiation depends on the surface finish and/or the surface finish quality of the reflecting means 6, 7. As means for reflection 6, 7 for reflecting the emitted radiation from the flat surface heating elements 14 different materials can be applied like Copper, Copper coating, Nickel, Nickel coating, Gold, Gold coating, Silver, Silver coating, Aluminum, Aluminum coating, or any combinations thereof. It is generally known that a polished surface with a quality≤N9 increases the reflected radiation and therewith decreases the thermal processing time.

In a preferred embodiment of the invention the means for reflection 6, 7 can be employed aluminum with a polished surface finish in a vertical, horizontal or inclined position. In a horizontal arrangement, as shown in FIG. 1, the system may be installed with the reflector arranged beneath, above, or on both sides, above and beneath, of the heater and/or substrate 2.

In regard of the cyclic processing time, repeatable process conditions, temperature wise, are essential for the system stability and process quality. As discussed, the method of temperature treatment of flat substrates 2 can determine the cycle time with regard to process temperature. Further to guarantee equal process conditions from substrate 2 to substrate 2 the thermal storage capacity, thermal mass of the means for reflection 6, 7, bus bars 9, heating elements 14, enclosure 1, and substrate carrier 3, have a central importance in direct relation to the cycle time therewith process quality.

In order to reduce the process temperature from said ≥900° C. to ≤450° C. after the electrical power has been switched off, various means for cooling 8, actively or passively, can be employed. A common technology are cooling liquids, e.g. water, oil or anything alike being in thermal contact with the means for reflection 6, 7, bus bars 9, heating elements 14, enclosure 1, and substrate carrier 3 and conduct the residue thermal load out of the said thermal processing chamber. In the first place the system design shall aim at reducing the mass in a thermal processing chamber.

According to an embodiment, a heating rate≥2.5K/s can be generated during the thermal processing of a substrate 2. Further after reaching the process temperature of a substrate 2, a thermal cool-down-rate of ≥5K/s leads to a dynamic, controllable heating system with no unwanted temperature overshoot effects. Here a heating element 14 thickness of less than 0.5 mm, preferably of 0.15 mm reduces the thermal mass and therewith positively influences the cool-down-rate. The minimum thickness is being delimited by the minimum electrical resistance and/or the mechanical stability. Therewith a precise temperature control can be achieved, which improves the following adjacent coating process.

According to one embodiment of the invention, a fast cool down rate is a prerequisite to reduce the influence of external residue reactant molecules on means for reflection 6, 7, bus bars 9, heating elements 14, enclosure 1, and substrate carrier 3, e.g. oxygen or alike, during the exposure to atmospheric pressure, while an unprocessed substrate 2 is transported into the processing chamber, said load lock. Therewith the mean time between failures of the heater configuration can be increased through avoiding for example oxidation caused by elevated temperatures in atmospheric pressure. Here an essential part of the inventive embodiment is to reduce the thermal mass of the flat heater element 14 through reducing the lamp housings to a minimum, i.e. to zero.

Therewith the total temperature uniformity, which is an essential prerequisite of the adjacent process, can be significantly increased to an extend of ≤+/−10K over the complete substrate 2. Thermal mass of lamp housings of prior art systems are an uncontrollable heat source and worse the total uniformity by extending the process time until thermal stability has been achieved.

Means for measuring the substrate 2 temperature like thermocouples and/or radiation thermometers can be foreseen additionally. When the end temperature is reached, the heating process is being stopped and a transport sequence is initiated to transport the heated substrate 2 out of the compartment e.g. in an adjacent evacuated process environment. Also a certain "holding" power applied to the heating assembly can be implemented to maintain a precisely adjusted temperature, time independent. Thus the heating assembly is fully controllable without generating a temperature overshoot.

During the heating process the substrate 2 can be moved periodically linearly or circularly by respective means of a movable substrate holder 3. Alternatively it can be placed steadily. Temperature distribution can thus be adjusted according to uniformity requirements. It proved to be successful that an oscillating motion improved the overall temperature distribution on the flat substrate 2. Additionally the gap between heating element 14 and substrate 2, which are essentially parallel planes, is kept at a defined distance of less than 50 mm, preferably less than 40 mm during the oscillation. The minimum distance is being defined technically but will rarely fall below 10 mm.

Further in order to improve the thermal distribution an optimization of the means for reflection 6, 7, proved to be successful. Here different surface patterns, changing the reflectivity, can improve the total uniformity. In the inventive embodiment different surface qualities e.g. different reflective coatings and/or surface finishing showed a changing temperature distribution and improved the layer quality in the adjacent process.

Further the gap distance d between the heating elements 14 can have an impact on the temperature distribution, in regard to the cavity effect. In the inventive embodiment the ratio gap distance d and thickness b of ≥2:1 has an impact on the temperature uniformity. Hence means of bus bars 9 can ensure constant positioning of the heating elements 14 to each other. Therewith the cavity effect can be minimized and the temperature distribution optimized.

In order to compensate edge losses, due to an increased surface 2 area, the flat heating element 14 assembly overlaps the substrate 2 surface area by at least ≥5% width b and length wise, e.g. 9 times width a+8 times distance d.

The heating system or heating element 14 assembly according to the present invention is not limited to the application as load lock heating system. It can be used generally for heating of extended 2-dimensional substrates 2 like panels, sheets or alike. Substrate 2 materials may encompass glass, glass-like materials, metals or other rigid materials. Compared to a prior art lamp arrangement with tube housings the current heating element 14 design has an improvement of total system efficiency of 200%. Therewith faster cycle times and subsequently a higher throughput can be achieved, which again optimizes the total cost of ownership for the vacuum processing system. Increasing the heating efficiency leads to an optimized energy input and utilization. Subsequently the media consumption can be decreased in comparison to traditional heating systems.

Heating elements 14 manufactured from carbon composite materials, carbon reinforced carbon materials, carbon fibers, SiC coated fibers, graphite, graphite fibers, SiC plates, or any combinations thereof, are subject to oxidation during operation in ambient atmosphere, unless protected by a housing. The present invention precludes oxidation due to maintaining a certain vacuum, which results in a near oxygen free atmosphere. A sacrificial electrode can be employed to prevent damage to the heating elements 14. It adsorbs or removes e.g. during pump-down residual oxygen from the process environment or load lock and thus warrants that the main heating elements 14 system is not damaged when put into operation. In waiving protective housings around the heating elements 14 the thermal processing time can be significantly reduced in comparison to the traditional method using heaters manufactured out of tungsten, carbon or any other refractory material with for example quartz housings.

The utilized heating material reduces the heater costs by a significant factor, i.e. by ≥300%. Due to the thickness b of the heating element 14 material the total thermal mass of the flat surface heating element 14 was minimized, which leads to an improved temperature control, waiving the application of any control means.

REFERENCE SIGNS LIST

1 Enclosure
2 Substrate
3 Substrate carrier
4 Substrate plane
5 Heating element
6 First reflecting means
7 Second reflecting means
8 Cooling unit
9 Bus bar
10 First plane surface
11 Second plane surface
12 First side
13 Second side
14 Heating element

The invention claimed is:

1. Vacuum substrate processing system comprising an enclosure, said enclosure comprising:
    a first reflector having a first extended heat-reflecting surface and a first back surface opposite to said first extended heat-reflecting surface;
    a second reflector having a second extended heat-reflecting surface pointing towards said first extended heat-reflecting surface of said first reflector and having a second back surface opposite to said second extended heat-reflecting surface;
    a heater arranged between said first and second reflector heat-radiating in a first direction towards said first reflector and equally heat-radiating in a second direction towards said second reflector;
    at least one substrate plane arranged between said heater and at least one of said first reflector and of said second reflector, said at least one substrate plane being freely exposed to said heater;
    a first cooling arrangement in heat-conducting contact with and along said first back surface of said first reflector; and
    a second cooling arrangement in heat-conducting contact with and along said second back surface of said second reflector,
    wherein the vacuum substrate processing system is configured such that a physical vapor deposition coating process provides a coating on a substrate in a substrate plane on the side facing away from the heater.

2. Vacuum substrate processing system according to claim 1, wherein at least one of said first cooling arrangement and of said second cooling arrangement comprises pipes adapted to circulate a cooling fluid.

3. Vacuum substrate processing system according to claim 1, wherein the heater is a resistive heater.

4. Vacuum substrate processing system according to claim 1, wherein the heater is arranged 50 mm distant from said at least one substrate plane being freely exposed to said heater.

5. Vacuum substrate processing system according to claim 1, wherein the heater is arranged 40 mm distant from said at least one substrate plane being freely exposed to said heater.

6. Vacuum substrate processing system according to claim 1, wherein the heater is arranged 10 mm distant from said at least one substrate plane being freely exposed to said heater.

7. Vacuum substrate processing system according to claim 1, wherein the surface of said heater has said at least one substrate plane freely exposed to, and greater than the surface of a substrate received in said at least one substrate plane.

8. Vacuum substrate processing system according to claim 1, wherein the heater comprises a material selected from the group consisting of carbon composite, carbon reinforced carbon, carbon fiber, SiC coated fiber, graphite, graphite fiber and/or SiC.

9. Vacuum substrate processing system according claim 1, wherein the enclosure comprises a bus bar for at least one of supporting the heater and of providing electrical energy to the heater.

10. Vacuum substrate processing system according to claim 1, wherein the enclosure comprises a substrate carrier for carrying the substrate to be treated in the substrate plane.

11. Vacuum substrate processing system according to claim 1, wherein at least one of the reflecting surfaces is of at least one of a material selected from the group consisting of copper, copper coating, nickel, nickel coating, gold, gold coating, silver, silver coating, aluminum and aluminum coating.

12. Vacuum substrate processing system according to claim 1, wherein at least one of the heat-reflecting surfaces having a surface roughness grade of ≤N9.

13. A method of processing a substrate or of manufacturing a processed substrate by means of a vacuum substrate processing system according to claim 1, comprising the steps of:
   a) providing a plane substrate (2) into the enclosure (1) such that the substrate (2) is provided in the substrate plane (4),
   b) evacuating the enclosure (1), and
   c) providing electrical power of 26 kW to the heating means (5) for heating the substrate (2).

14. Method according to claim 13, wherein the substrate is a plane substrate having a surface size of at least 1 m².

15. Method according to claim 13, comprising the step of evacuating the enclosure to between $8*10^{-2}$ mbar and to $1*10^{-5}$ mbar.

16. Method according to claim 13, comprising the step of heating the substrate with a heating rate of 2.5 K/s.

17. Method according to claim 13, wherein the substrate is periodically moved within the enclosure.

18. Method according to claim 13, wherein the substrate is linearly moved within the enclosure.

19. Vacuum substrate processing system comprising an enclosure, said enclosure comprising:
   a first reflector having a first extended heat-reflecting surface and a first back surface opposite to said first extended heat-reflecting surface;
   a second reflector having a second extended heat-reflecting surface pointing towards said first extended heat-reflecting surface of said first reflector and having a second back surface opposite to said second extended heat-reflecting surface;
   a heater arranged between said first and second reflector heat-radiating in a first direction towards said first reflector and equally heat-radiating in a second direction towards said second reflector;
   at least one substrate plane arranged between said heater and at least one of said first reflector and of said second reflector, said at least one substrate plane being freely exposed to said heater;
   a first cooling arrangement in heat-conducting contact with and along said first back surface of said first reflector; and
   a second cooling arrangement in heat-conducting contact with and along said second back surface of said second reflector,
   wherein the vacuum substrate processing system is configured such that a physical vapor deposition coating process provides a coating on a substrate in a substrate plane on the side facing away from the heater, and
   and wherein the heater comprises a plurality of rectangular heating elements, each heating element having a length, a width and a thickness, the heating elements being electrically connected with at least one pair in series and at least one pair in parallel, the heating elements being arranged along their widths and lengths in a plane parallel to said at least one substrate plane.

20. Vacuum substrate processing system according to claim 19, wherein the heating elements being arranged adjacent to each other.

21. Vacuum substrate processing system comprising an enclosure, said enclosure comprising:
   a first reflector having a first extended heat-reflecting surface and a first back surface opposite to said first extended heat-reflecting surface;
   a second reflector having a second extended heat-reflecting surface pointing towards said first extended heat-reflecting surface of said first reflector and having a second back surface opposite to said second extended heat-reflecting surface;
   a heater arranged between said first and second reflector heat-radiating in a first direction towards said first reflector and equally heat-radiating in a second direction towards said second reflector;
   at least one substrate plane arranged between said heater and at least one of said first reflector and of said second reflector, said at least one substrate plane being freely exposed to said heater;
   a first cooling arrangement in heat-conducting contact with and along said first back surface of said first reflector; and
   a second cooling arrangement in heat-conducting contact with and along said second back surface of said second reflector,
   wherein the vacuum substrate processing system is configured such that a physical vapor deposition coating process provides a coating on a substrate in a substrate plane on the side facing away from the heater,
   wherein the enclosure is the enclosure of a load lock comprising a sealable opening such that the enclosure is accessible without breaking the vacuum when provided within the vacuum substrate processing system.

\* \* \* \* \*

UNITED STATES PATENT AND TRADEMARK OFFICE
CERTIFICATE OF CORRECTION

PATENT NO. : 10,276,412 B2
APPLICATION NO. : 13/812289
DATED : April 30, 2019
INVENTOR(S) : Edwin Pink and Philipp Hotz Page 1 of 1

It is certified that error appears in the above-identified patent and that said Letters Patent is hereby corrected as shown below:

In the Claims

Claim 13, Column 13, in item "C", Line 12, please delete the phrase "power of 26 kW" and replace with "power of $\geq$ 26 kW".

Signed and Sealed this
Eighteenth Day of June, 2019

Andrei Iancu
*Director of the United States Patent and Trademark Office*